United States Patent [19]

Cook, Jr.

[11] 4,056,681

[45] Nov. 1, 1977

[54] SELF-ALIGNING PACKAGE FOR INTEGRATED CIRCUITS

[75] Inventor: Charles R. Cook, Jr., North Palm Beach, Fla.

[73] Assignee: International Telephone and Telegraph Corporation, Nutley, N.J.

[21] Appl. No.: 601,854

[22] Filed: Aug. 4, 1975

[51] Int. Cl.² ............................................. H05K 5/00
[52] U.S. Cl. ................................. 174/52 FP; 29/626; 204/15
[58] Field of Search ............... 174/52 FP, 52 PE; 317/101 CC, 101 CP; 204/15; 29/625, 626, 627

[56] References Cited

U.S. PATENT DOCUMENTS

| 3,035,990 | 5/1962 | Davis et al. ............................ 204/15 |
| 3,374,537 | 3/1968 | Doelp .............................. 174/52 FP |
| 3,469,684 | 9/1969 | Keady et al. ..................... 174/52 FP |
| 3,544,857 | 12/1970 | Byrne et al. ................. 174/52 PE X |
| 3,659,035 | 4/1972 | Planzo .......................... 174/52 PE X |
| 3,698,074 | 10/1972 | Helda et al. ............................. 29/626 |
| 3,741,880 | 6/1973 | Shiba et al. ......................... 204/15 X |
| 3,832,603 | 8/1974 | Cray et al. ................. 317/101 CC X |
| 3,902,148 | 8/1975 | Drees et al. ............................. 357/70 |

Primary Examiner—J. V. Truhe
Assistant Examiner—D. A. Tone
Attorney, Agent, or Firm—John T. O'Halloran; Peter C. Van Der Sluys

[57] ABSTRACT

A self-aligning integrated circuit package includes an integrated circuit die having raised contact pads mounted to an interconnecting die in flip chip fashion. The interconnecting die is formed of anodizable material and has raised anodized portions that form guide means for aligning the integrated circuit die and the leads of a lead frame so that they are positioned over conductive portions of the interconnecting die which connect the contact pads of the integrated circuit to the leads of the lead frame.

69 Claims, 28 Drawing Figures

SELF-ALIGNING PACKAGE FOR INTEGRATED CIRCUITS

BACKGROUND OF THE INVENTION

1. Field of the Invention

The present invention relates to integrated circuit packaging and more particularly to a self-aligning integrated circuit package.

2. Description of the Prior Art

Modern automated techniques for manufacturing integrated circuits have resulted in a substantial reduction in the cost of integrated circuit chips. A substantial portion of the cost of a completed integrated circuit device is attributable to packaging. The high cost of packaging integrated circuits primarily results from the difficulty encountered in making electrical contact to the integrated circuit chip. Some usuable form of lead must be brought out from the small contact pads of the integrated circuit.

The semiconductor industry has established standard lead configurations; however, these leads must be electrically connected to the contact pads on the circuit chip. Many schemes have been devised for connecting the leads to the contact pads; however, the practice of using fine interconnecting wires still prevails as the industry standard.

The standard practice was to bond fine gold or aluminum wire leads to the contact pads on the chip and to the individual leads of a standard lead configuration. This procedure required at least 28 separate bonding steps which resulted in high labor cost. The use of gold wire leads also resulted in high material cost and other technical difficulties such as the purple plague.

In an attempt to eliminate the need for wire leads, the contact frame leads were bonded directly to the contact pads on the chip. This procedure resulted in some success but required larger size contct pads and resulted in increased chip size.

Another solution described in U.S. Pat. No. 3,676,922 proposed the use of a conductive metal sheet spread over the chip and leads and bond thereto to interconnect the contact pads on the chip to the leads. Thereafter, the undesired portions of the conductive metal sheet were removed using a standard photo-resist and etching technique. This procedure allowed for the use of standard lead frames and contact pads; however, the interconnecting metal sheet was relatively thin and not strong enough for all applications.

SUMMARY OF THE INVENTION

The present invention relates to a novel packaging technique for integrated circuits wherein the material cost is substantially reduced and assembly may be automated to significantly reduce the labor cost. Thus, the present invention results in a substantial reduction in the packaging cost of an integrated circuit.

The present invention contemplates the use of a standard integrated circuit die having raised bonding pads. The pads may be formed in a manner as described in a co-pending patent application of R. Scherrer, Ser. No. 601,856, filed August 4, 1975 or by a plating process for building up the bonding pads. An interconnecting die formed of an anodizable material is used to provide the interconnection between the contact pads on the standard integrated circuit die and the leads of a standard lead frame thereby eliminating the use of gold plated wire and a number of bonding steps. Self-alignment is achieved by selectively anodizing portions of the interconnecting die to form raised portions for guiding the integrated circuit die and the lead frame leads into position on the interconnecting die.

In one embodiment the interconnecting die is formed of silicon and has metalized conducting strips formed thereon for providing the connection between the contact pads of the integrated circuit die and the lead frame.

In another embodiment, the interconnecting die is formed of aluminum which is selectively anodized to form non-conducting regions which also functions as guide members for the integrated circuit die and the lead frame leads.

After the circuit die is bonded to the interconnecting die, a glass frit is applied over the circuit die and surrounding area which is thereafter fired to provide a hermetic seal about the integrated circuit. The circuit is encapsulated in epoxy to the desired form factor to provide the required strength.

The primary objective of the present invention is to provide a low cost package for an integrated circuit.

Another objective of the present invention is to provide a more reliable integrated circuit.

Another objective of the present invention is to provide an integrated circuit having heat sinks on both sides for providing for higher power dissipation.

Another objective of the present invention is to provide a package design wherein all alignment steps may be automated.

Another objective of the present invention is to provide an integrated circuit package having the hermeticity of a ceramic package combined with the ruggedness of a plastic package. p Another objective of the present invention is to provide an integrated circuit that does not require gold leads.

The foregoing and other objectives and advantages of the present invention will become more apparent from the following description and the accompanying drawings wherein two embodiments of the present invention are described.

DESCRIPTION OF THE PREFERRED EMBODIMENT

Figure 1:
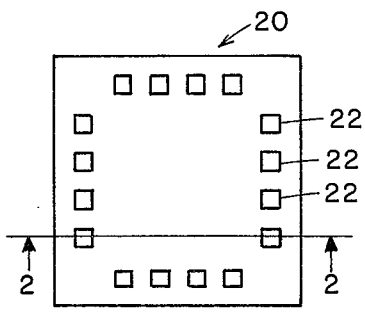
FIG. 1 is a plan view of a standard integrated circuit die.

Referring to FIG. 1, there is shown a typical integrated circuit chip or die 20 having contact pads 22 formed thereon. The circuit includes internal connections between the active parts of the circuit and said contact pads. The contact pads 22 may be formed in accordance with the teachings of a co-pending U.S. patent application Ser. No. 601,856 of Raymond Scherer entitled "Contact Pad For A Semiconductor Device", or by a plating process. In the Scherrer application which is incorporated herein by reference, there is described how a raised contact pad may be easily formed on a semiconductive material using silicon anodization techniques.

Figure 2:
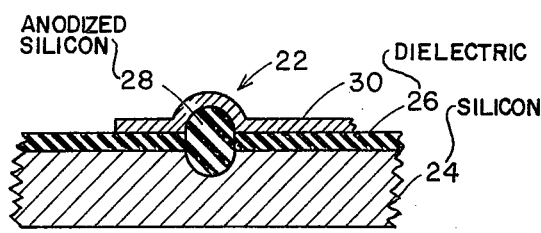
FIG. 2 is a partial vertical section taken along line 2—2 of FIG. 1 showing a portion of the integrated circuit die.

Referring to FIG. 2, there is shown a vertical section through a typical contact pad formed in accordance with the method described in the Scherrer patent application. The surface of semiconductive material 24 is subjected to an oxidizing process to from a dielectric layer 26. While oxidizing the semiconductive material is the preferred method for providing the dielectric layer, the layer may be formed by depositon of silicon nitride or an oxide so long as the layer is a dielectric.

Using a conventional photo-resist process and etching, portions of layer 26 are removed from the areas under pads 22 to expose the semiconductive material in layer 24. The remaining portions of layer 26 form a mask for a subsequent anodization step.

The exposed semiconductive material 24 in the pad areas is anodized to form a dielectric material. During the anodization process, the semiconductive material in the pad area forms an anode when a positive potential is applied to material 24 while submerging the material into an anodizing solution containing an electolyte and a cathode.

The anodized semiconductive material 28 has increased size to form a raised pad area which should extend 1 to 2 mils above the surface of the die. In order to form anodized material of sufficient thickness, the anodized material must be porous so that anodization is not stopped by the insulating characteristic of the anodized material. A porous material is formed by using an electrolyte of the type that etches the anodized material at an appreciable rate so as to form pores as the material is formed so that anodization continues. If the electrolyte does not have this characteristic, only a thin anodic film will be formed and the pad area will not be raised sufficiently.

In general, acidic electrolytes form porous anodic films that will develop to a sufficient thickness as shown in FIG. 2 if the proper conditions of acid concentration, electrolyte temperature and anodizing current level are provided. Electrolytes made of boric, sulfuric, nitric and phosphoric acids proved to be particularly useful. Generally speaking, hydrofluoric acid was found to be too strong in that it attacks the oxide layer 26 too rapidly.

A phosphoric acid type of electrolyte is preferred since it provides for rapid anodization at room temperatures and the V/I curve for the anodization is smooth and does not contain any disruptions between the slow and fast anodization modes thereby making it easy to induce the rapid exothermic type anodization as discussed in the Scherrer application.

After anodization, aluminum 30 is deposited on the pad area to form the contact pads 22.

If plating is to be used to build up the raised contact pads, openings to the desired contact areas are formed in the typical glass passivation layer and thereafter a layer of aluminum 1000 to 2000 A thick is evaporated over the surface of the die. A mask is then formed and opened over the contact pad areas which are then plated with zinc for making good contact with the aluminum, nickel for getting the desired height and then tin for providing a good soldering surface. A layer of solder may also be added depending upon the type of bonding that is to be subsequently used. the total height of the pads should be 1 to 2 mils. After pad formation, the mask and evaporated aluminum layer are removed which may be accomplished by etching.

Figure 3:
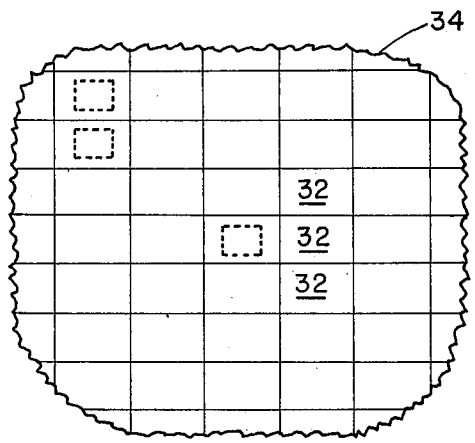
FIG. 3 is a plan view of a sheet of anodizable material from which an interconnecting die may be formed.
Figure 4:
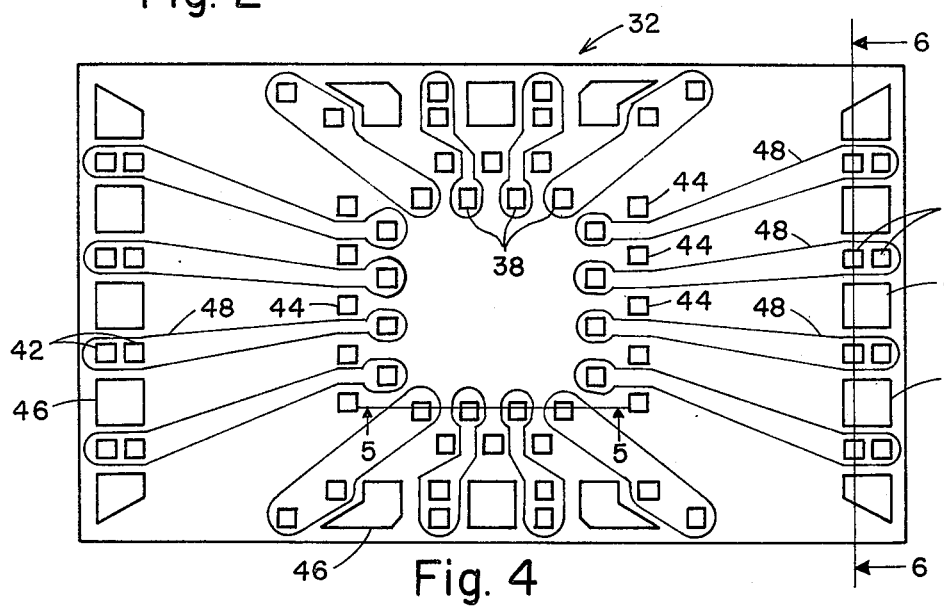
FIG. 4 is a plan view of an interconnecting die constructed in accordance with the present invention.
Figure 5A:
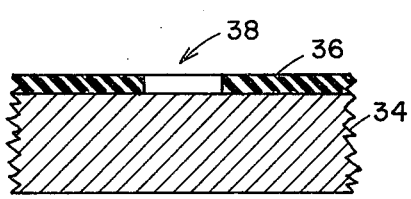
FIGS. 5A through 5D are vertical sections taken along line 5—5 of FIG. 4 showing a portion of the interconnecting die during various stages of its fabrication.
Figure 5D:
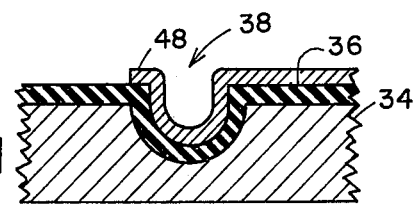
Figure 5B:
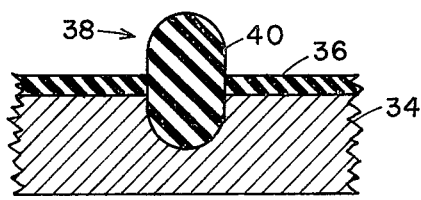
Figure 5C:
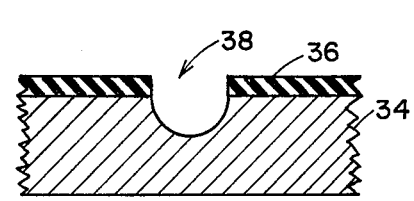
Figure 6A:
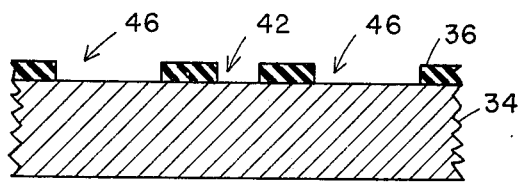
FIGS. 6A through 6C are vertical sections taken along line 6—6 of FIG. 4 showing a portion of the interconnecting die during various stages of its fabrication.
Figure 6B:
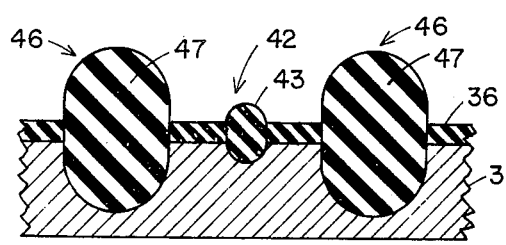
Figure 6C:
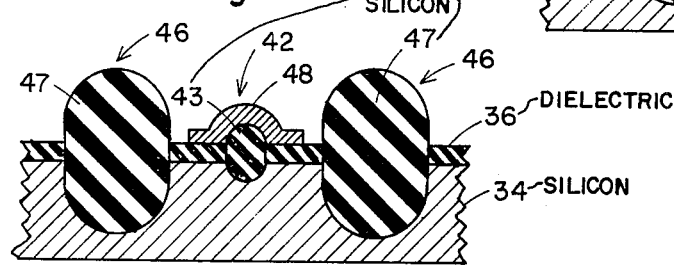

The integrated circuit die 20 is connected to a lead frame through the use of an intermediate interconnecting die 32 as shown in FIG. 4. A plurality of interconnecting dice 32 may be formed from a sheet 34 of anodizable material such as silicon as shown in FIG. 3. After the dice 32 are completely formed sheet 34 may be broken into the individual die 32 using standard techniques. Referring to FIGS. 4 and 5A-5D, sheet 34 is subjected to an oxidizing process to form a dielectric layer 36 in a manner similar to that described for forming the dielectric layer 26 shown in FIG. 2. Using conventional photo-resist and etching methods, portions of the dielectric layer 36 are removed from selected contact regions 38 which correspond in position to the contact pads 22 of the integrated circuit die 20. Sheet 34 is thereafter subjected to an anodizing process as previously described to form anodized silicon 40 in regions 38. Anodized silicon 40 is thereafter removed using a 10% solution of hydrofluroic acid so as to provide depressions in regions 38 as shown in FIG. 5C. The entire surface of sheet 34 is again oxidized to reform the dielectric layer 36. Portions 42, 44 and 46 of the dielectric layer 36 are removed using a photo-resist process to form openings as shown in FIGS. 4 and 6a. the sheet 34 is again subjected to an anodizing process to form anodized silicon 43 and 47 in regions 42, 44 and 46 as shown in FIG. 6b. It is to be noted that in the larger areas such as regions 46 a greater bulk of anodized silicon is formed that extends higher than the anodized silicon in the smaller areas 42. It is desirable that the anodized silicon in regions 46 be grown to a height slightly lower than the top of the leads which are to be positioned in regions 42.

Aluminum 48 is deposited on selected regions of sheet 34 to provide electrical contact between regions 38 and 42. Thus, the deposited aluminum lines the depressions 38 as shown in FIG. 5D and covers the anodized silicon 43 in regions 42.

At this point in the fabrication process, it may be desirable to scribe sheet 34 to separate the individual die; however, the scribing could take place after attaching the integrated circuit die 20 to the interconnecting die 32.

Figure 8:
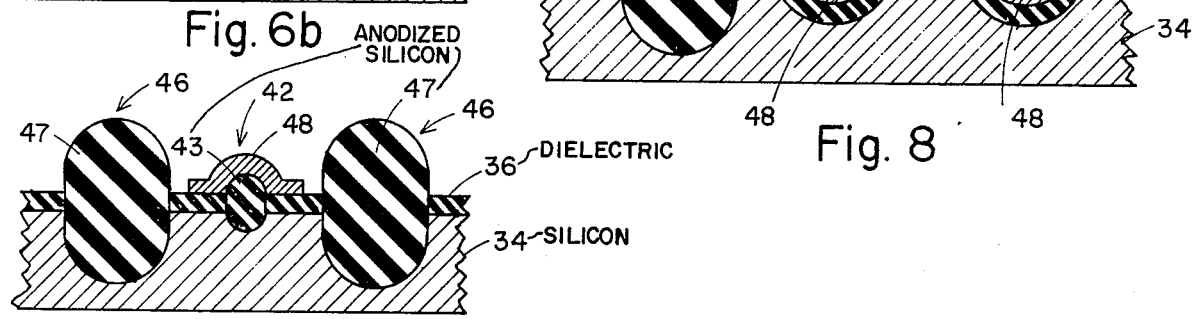
FIG. 8 is a vertical section taken along line 8—8 of FIG. 7 showing a portion of the integrated circuit die and interconnecting die.
Figure 7:
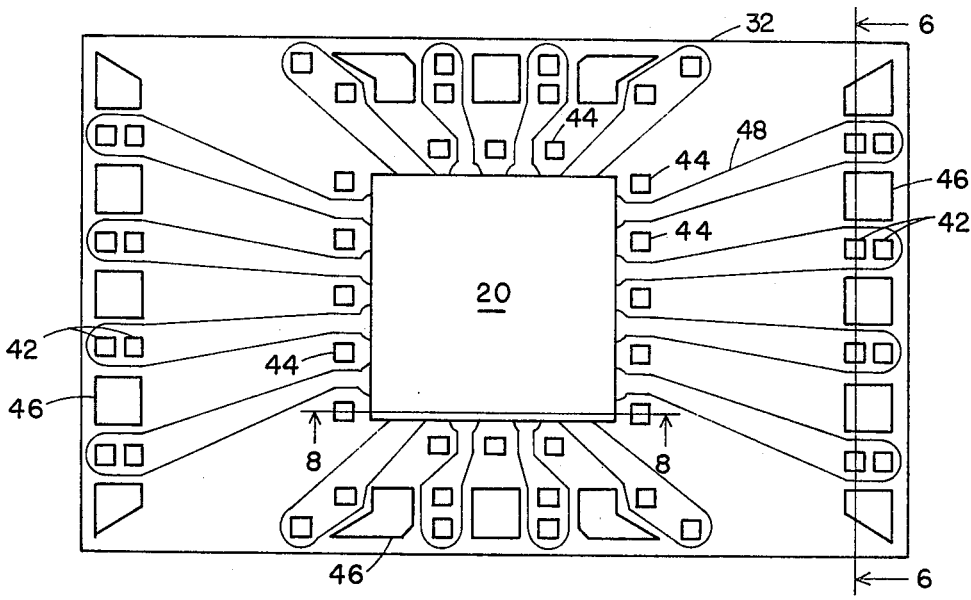
FIG. 7 is a plan view of the interconnecting die of FIG. 4 with the integrated circuit die of FIG. 1 positioned thereon.

The integrated circuit die 20 is attached to the interconnecting die 32 as shown in FIGS. 7 and 8. Die 20 is guided into position by raised portions 44 so that the raised contact pads 22 mate with the depression 38 on the interconnecting die. Thermo compression bonding may be used to permanently connect the contact pads 22 to regions 38 if the aluminum coated pads of Scherrer are used, or bonding may be by soldering or brazing in a chain furnace if plated pads are used.

A glass frit 50 is applied over the integrated circuit die 20 in the surrounding area of the die 32 and is thereafter fired to provide a hermetic seal equivalent to that of a ceramic package.

Figure 9:
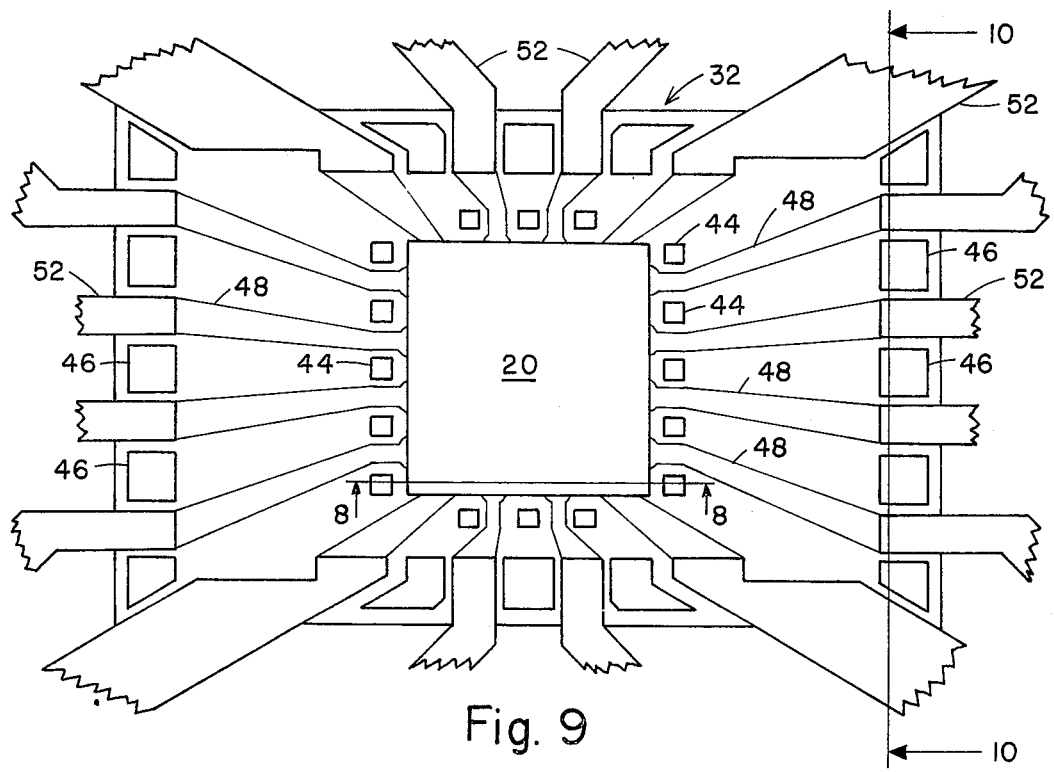
FIG. 9 is a plan view of the interconnecting die of FIG. 7 with leads attached thereto.
Figure 10:
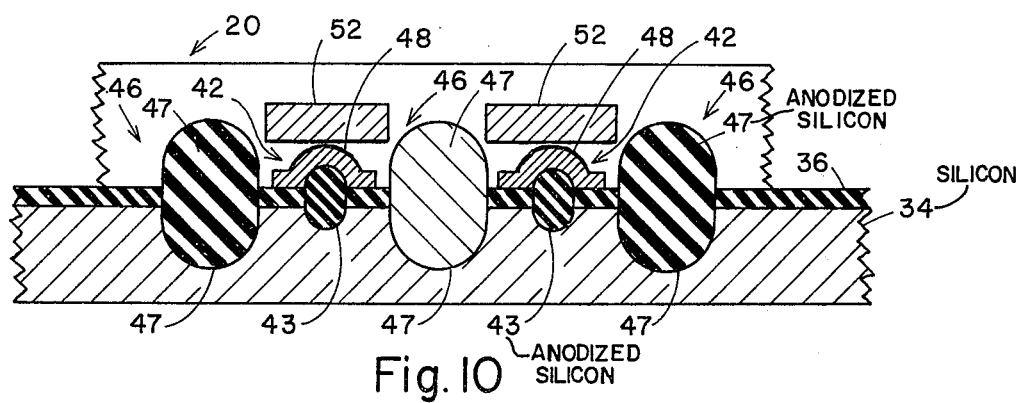
FIG. 10 is a vertical section taken along line 10—10 of FIG. 9 showing a portion of the interconnecting die with leads connected thereto.
Figure 11:
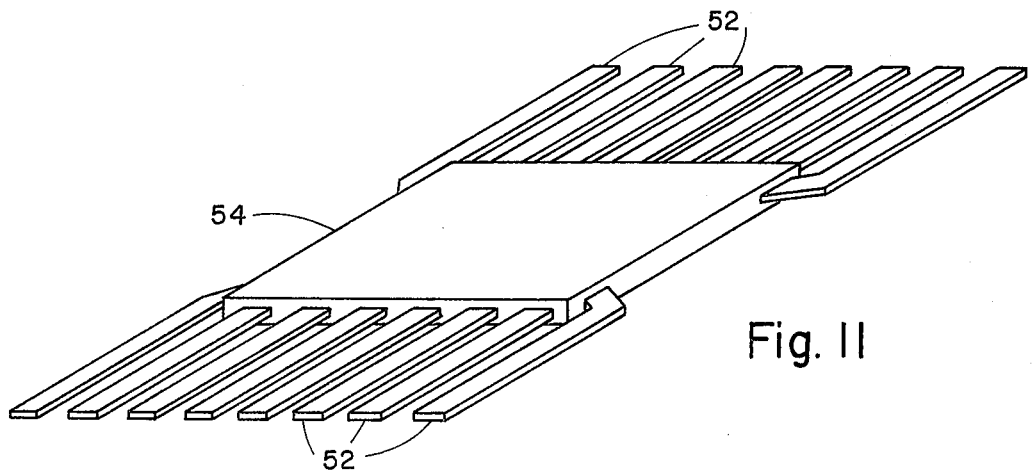
FIG. 11 is a perspective view of an encapsulated integrated circuit.

Referring to FIG. 9, there is shown how a standard lead frame having leads 52 formed of Kovar aluminum is positioned over the interconnecting die 32. The leads 52 are guided into position to contact regions 42 by the anodized silicon material 47 in regions 46 as clearly shown in FIG. 10. The leads 52 of the lead frame are then bonded to regions 42 of the interconnecting die 32 by any of the accepted bonding methods such as thermo-compression soldering or welding. The assembly is ready for encapsulation in a package 54 which is preferably formed of epoxy molded to a standard form factor as shown in FIG. 11. The epoxy provides additional strength to the package to complement the excellent hermeticity of the glass seal.

In a second and preferred embodiment of the present invention the interconnecting die is formed of aluminum rather than silicon. Aluminum is preferred since it reduces the cost to about ½ of the cost of the silicon die. An aluminum sheet 12 inches square and having a thickness of 12 mils may be used to form about 7,200 interconnecting dice. The interconnecting dice are formed on a sheet of aluminum in a manner similar to that shown in FIG. 3 so that the individual die may later be separated by standard techniques such as scribing and braking or by sawing.

Figure 12:
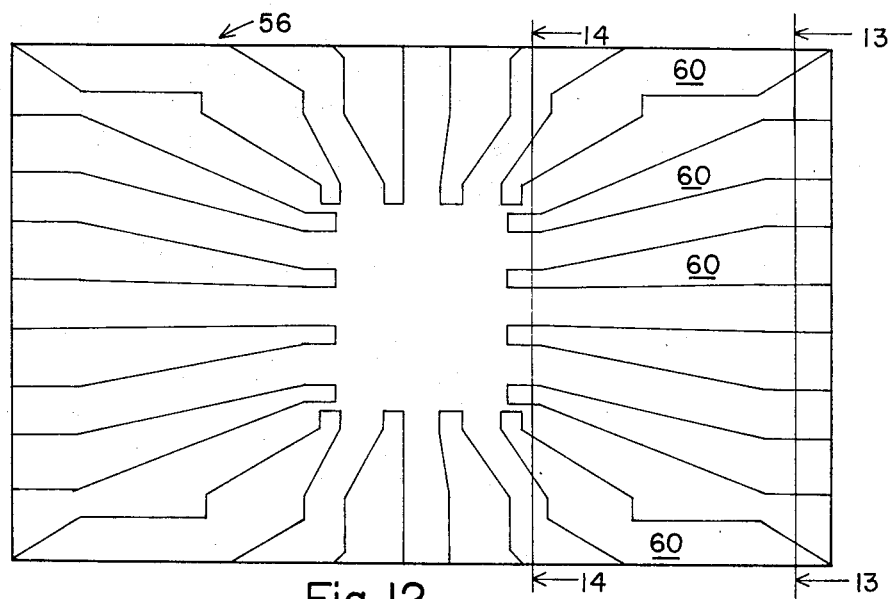
FIG. 12 is a plan view of an interconnecting die constructed in accordance with a second embodiment of the present invention.

Referring to FIG. 12, there is shown an aluminum interconnecting die 56 which represents a portion of a sheet of aluminum as shown in FIG. 3.

Interconnecting die 56 is masked using a Vapox layer and a photo-resist to provide masking over regions 60 that are to ultimately be conducting regions. The Vapox layer is used because it stands up better during subsequent anodization. A preferred photo-resist for aluminum is XP-7310 which has a high J and is sold by Shipley of Nutley, N.J. After regions 60 are masked, the aluminum sheet is anodized in a manner similar to that previously described using an acidic electrolyte containing sulfuric, phosphoric, oxalic or chromic acid. The preferred electrolyte contains 660 milliliters of sulfuric acid, 56 grams of oxalic acid crystal and 4,228 mililiters of deionized water. The electrolyte temperature is preferably 0 to 10° C and the applied potential is between 10 to 50 volts pulsed at about 30 Hz with a 10 percent duty cycle to provide a current density of about 600 milliamps average per square inch.

The applied voltage and current density may be varied considerably and the highest rate of anodization is preferred provided breakdown of the Vapox does not occur.

Anodization is continued at a controlled rate until approximately 6 mils of anodized aluminum 58 is developed.

Figure 13:
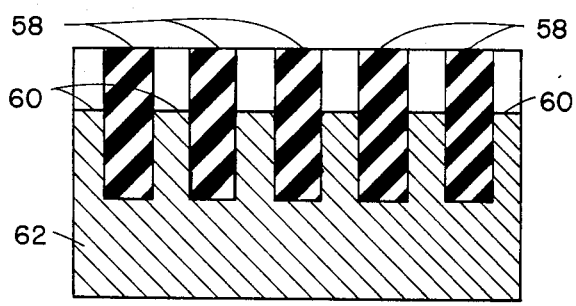
FIG. 13 is a vertical section taken along line 13—13 of FIG. 12.
Figure 14:
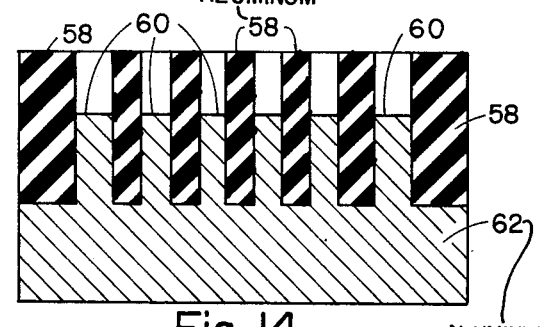
FIG. 14 is a vertical section taken along line 14—14 of FIG. 12.
Figure 15:
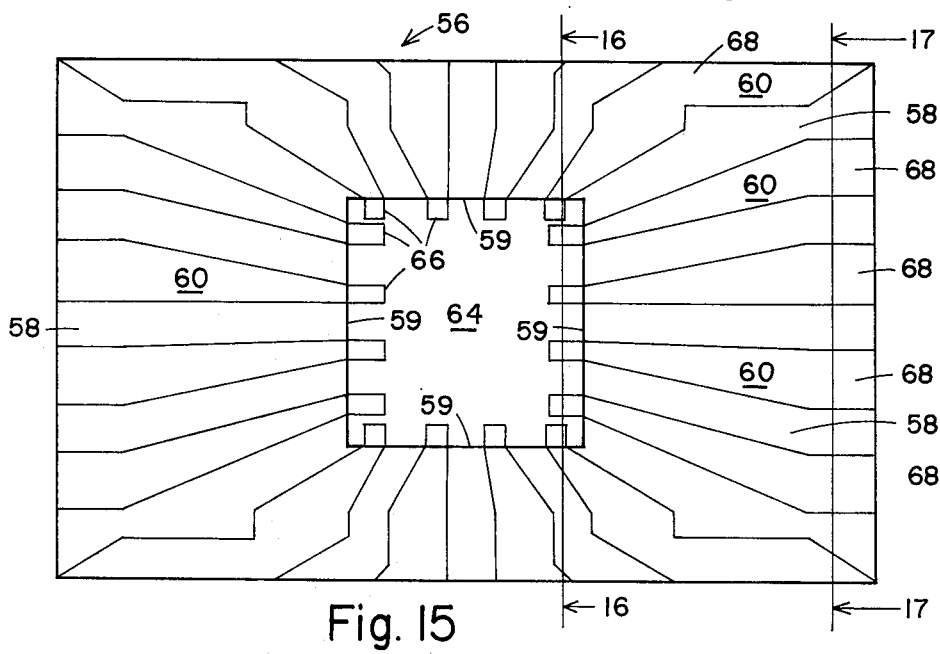
FIG. 15 is a plan view of the die of FIG. 12 shown at another stage of its fabrication.

Referring to FIGS. 13 and 14, there is shown how the anodized aluminum 58 extends above the unanodized surface 60 of the aluminum 62 of sheet 56. Die 56 is again masked so that only a central portion 64 is exposed as shown in FIG. 15. Portion 64 corresponds in shape to and is a little larger in size than the integrated circuit chip 20 which is to be mounted on die 56. The anodized aluminum in central portion 64 is partially removed using a hydrofluroic acid zinc sulfate solution in a plating bath which acts to both etch the anodized aluminum and plate zinc to aluminum surfaces 60.

The preferred solution contains approximately 30 ounces of zinc sulfate crystals $(Z_nSO_y \cdot 7H_2O)$ per gallon of deionized water and 3.5 percent by volume of 18 percent hydrofluoric acid. Plating could be electroless but the application of a potential is preferred since it speeds up the process and allows for the use of a more dilute solution. The plating and etching are continued till about 1 mil of anodized aluminum remains above surface 60. After removal of a portion of the anodized aluminum and the simultaneous zinc plating the central portion 64 is depressed as shown in FIG. 16 having a level surface 65 and side walls 59. Surface 65 of anodized aluminum is provided for supporting the integrated circuit die 20 when it is mounted in the interconnecting die 56 and a layer 66 of zinc is provided on the aluminum surfaces 60 within portion 65. As is most clearly shown in FIG. 16, layer 66 is at a lower level than the surface 65 thereby forming depressions in the surface for receiving the raised contact pads of the die 20 and providing for alignment of the die 20 on the interconnecting die 56. Depending upon the type of bonding to be used additional plating steps may be desired to add a layer of tin or nickel and tin on layer 66.

Figure 16A:
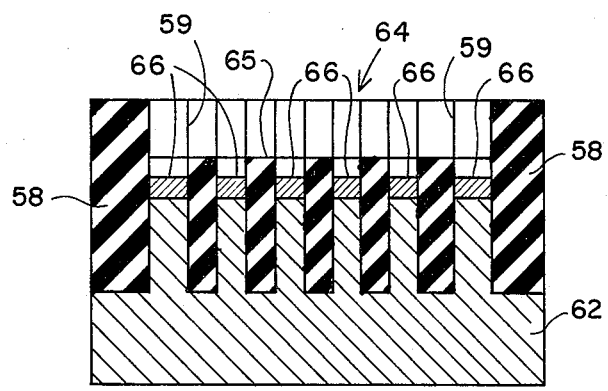
FIGS. 16A through 16D are vertical sections taken along line 16—16 of FIG. 15 showing various stages and embodiments of die fabrication.
Figure 16B:
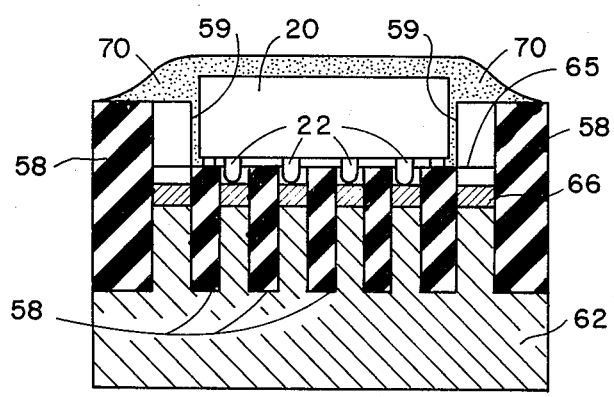

The interconnecting die 56 is now sufficiently prepared for mounting of the integrated circuit die 20 as shown in FIG. 16B. The integrated circuit die 20 is roughly guided by the side walls 59 of anodized aluminum 58 so that it slides into central portion 64 and the raised contact pads 22 of the primary die 20 mate with the depressions formed by portions of layer 66 in central portion 64 of the of the interconnecting die. The contact pads 22 are bonded to layer 66 using standard bonding techniques such as brazing or soldering in a chain furnace and thereafter the integrated circuit die and the surrounding area of the interconnecting die are glazed with a glass frit 70 and fired to provide a heremetic seal for the integrated circuit.

Figure 17:
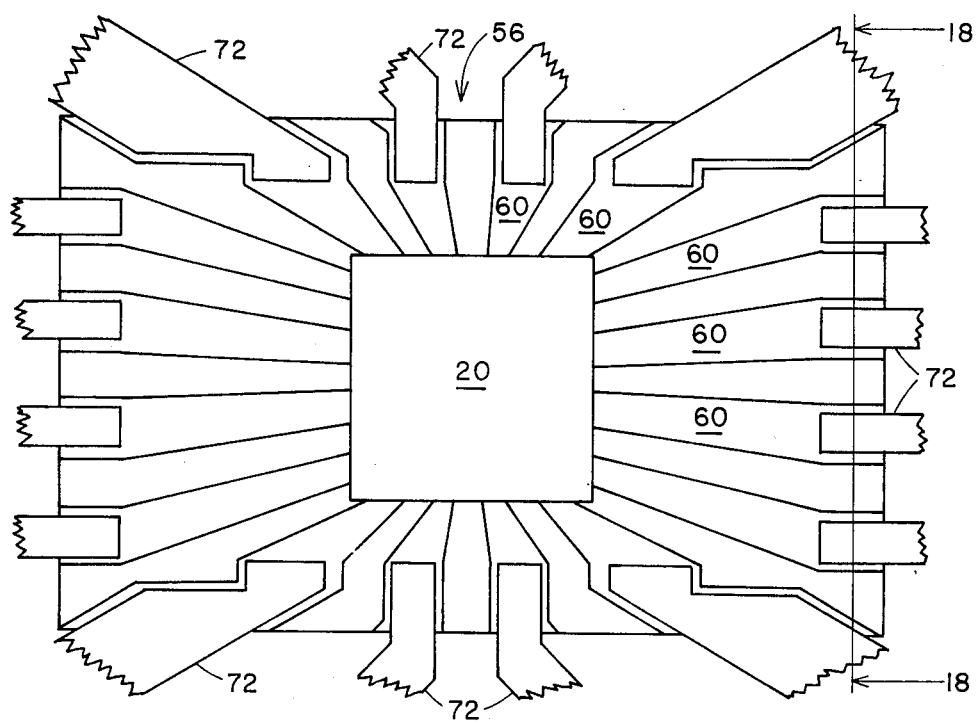
FIG. 17 is a plan view of the interconnecting die showing a lead frame attached thereto.
Figures 18A, 18B, 18C:
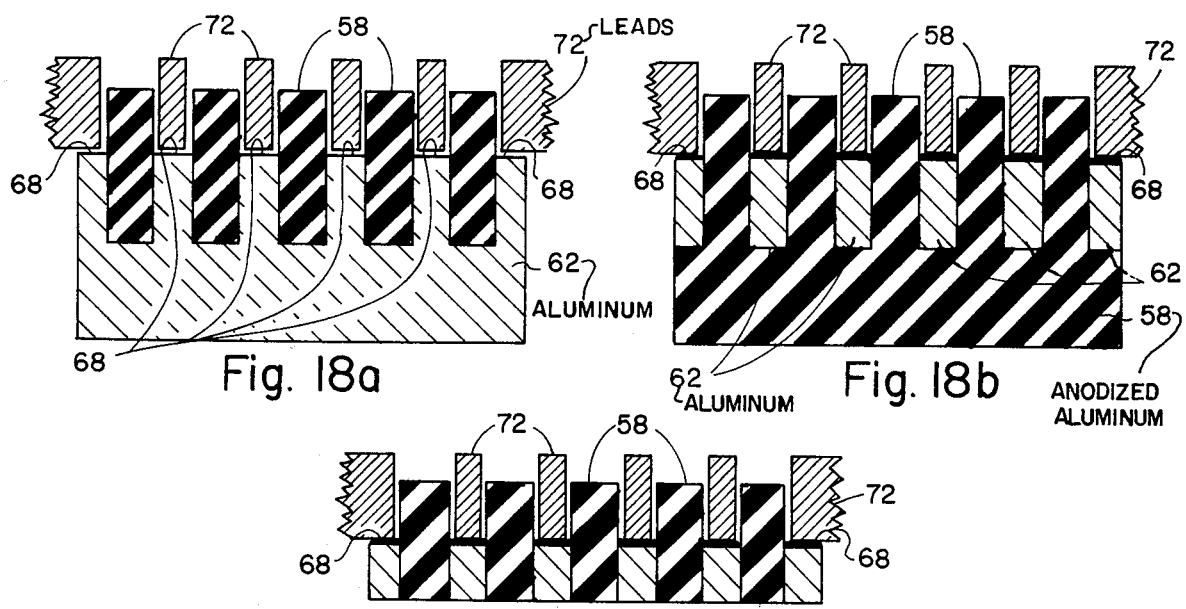
FIGS. 18A to 18C are vertical sections taken along line 18—18 of FIG. 17 showing various stages fo fabrication of the integrated circuit.

At this point in the manufacturing process, the aluminum sheet must be divided to form individual interconnecting dice 56 if this was not done prior to mounting the circuit die 20. A lead frame having leads 72 is positioned so that leads 72 are guided to positions over aluminum contact areas 68 of die 56 as shown in FIGS. 17 and 18A. The leads 72 are guided into position by the anodized aluminum 58 as shown in FIG. 18A and are thereafter bonded to the aluminum contact areas 68 using a welding technique wherein the Kovar lead is welded to the aluminum. Nickel could be plated to the alumunum prior to welding if desired.

Figure 16C:
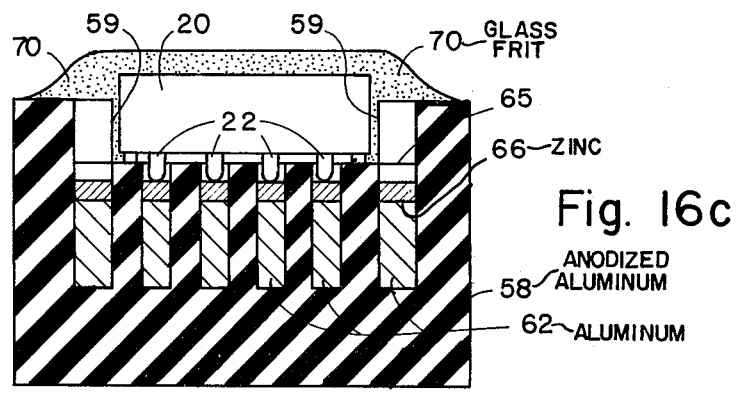

The interconnecting die may be then further anodized to provide anodized aluminum on the reverse side of the die. Anodization would be continued until the unanodized aluminum 62 in conducting regions 60 are isolated by anodized aluminum 58 as shown in FIGS. 16C and 18B.

Figure 16D:
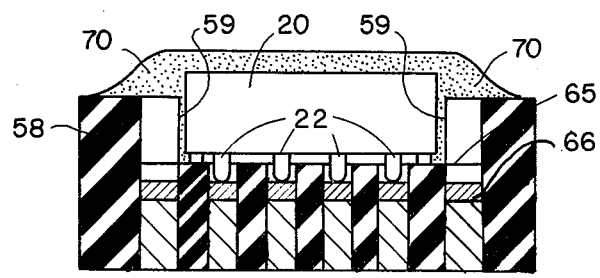

Preferably, the aluminum on the reverse side is removed by etching in a mixture of Hydrochloric acid and Hydrogen Peroxide until sufficient aluminum is removed so that the aluminum 62 in conducting regions 60 is isolated as shown in FIGS. 16D and 18C.

The completed device is then encapsulated in an integrated circuit package 54 is shown in FIG. 11 preferably by molding epoxy about the device.

Thus, the present invention provides a self-aligning package for integrated circuits that is substantially lower in cost than those of the prior art. The package provides the hemeticity of a ceramic package by using a glass seal and additional strength is provided by the epoxy encapsulation. The use of an interconnecting die also provides a substantial heat sink so that high power dissipation may be tolerated. The fabrication of the device may be completely automated through the unique use of guides formed of anodized material for both the integrated circuit die and the lead frame.

What is claimed is:

1. An interconnecting die for use in integrated circuit packaging for connecting contact means of an integrated circuit die with contact means of an integrated circuit package, said interconnecting die comprising:
   a substrate of anodizable electrically conductive material including unanodized conducting regions and anodized non-conducting regions;
   first contact means associated with said substrate to contact the contact means of the integrated circuit die when placed in juxtapostion and properly aligned with the integrated circuit die; and
   second contact means associated with said substrate to contact the contact means of the integrated circuit package when placed in juxtaposition and properly aligned therewith, said conducting regions of the substrate being formed and arranged for electrically connecting said first and second contact means of the interconnecting die, whereby the contact means of the integrated circuit die and the contact means of the package may be connected using a single element with a minumum of bonding steps.

2. An interconnecting die as described in claim 1, additionally comprising guide means formed on said substrate for cooperating with the integrated circuit die to align the integrated circuit die so that the first contact means are in juxtaposition with the contact means of the integrated circuit die.

3. An interconnecting die as described in claim 2, wherein the guide means are formed of anodized material.

4. An interconnecting die as described in claim 2, wherein the substrate is formed of aluminum and the guide means and non-conducting regions comprise anodized aluminum which electrically isolates the conducting regions of aluminum.

5. An interconnecting die as described in claim 1, additionally comprising guide means formed on said substrate for cooperating with the package contact means to align said contact means with the second contact means.

6. An interconnecting die as described in claim 1, wherein the substrate is formed of anodizable material and the second contact means include anodized material covered by a layer of aluminum.

7. An interconnecting die as described in claim 1, wherein said substrate is formed of anodized aluminum and the conducting regions and contact means comprise unanodized portions of the substrate.

8. An interconnecting die as described in claim 7, additionally comprising a layer of metal plated on the surface of the first contact means.

9. An interconnecting die as described in claim 7, wherein the anodized aluminum is between the ananodized portions thereby isolating the conducting regions.

10. An interconnecting die as described in claim 9, wherein the anodized aluminum between the unanodized aluminum extends upwardly above the contact means for guiding and receiving the contact means of the circuit die and the package.

11. An interconnecting die as described in claim 1, additionally comprising an integrated circuit die mounted to said substrate so that the contact means of the integrated circuit die are connected to the first contact means.

12. An interconnecting die as described in claim 11, additionally comprising a glass frit sealing said integrated circuit die to said substrate.

13. A self-aligned integrated circuit device, comprising:
    an integrated circuit die having contact means formed thereon at predetermined locations;
    an interconnecting die formed of a substrate of an anodizable material and having a first set of contact means in juxtaposition with and bonded to the contact means of the integrated circuit die and a second set of contact means electrically connected to the first set of contact means by conducting regions of said substrate, said conducting regions being electrically isolated by non-conducting regions of said substrate;
    first guide means formed of anodized material on said interconnecting die for aligning the integrated circuit die on the interconnecting die;
    connecting means connected to the second set of contact means; and
    encapsulating means surrounding and sealing said integrated circuit die and interconnecting die, said connecting means being exposed for connection to external elements.

14. A device as described in claim 13, wherein the anodizable material is silicon.

15. A device as described in claim 13, wherein the anodizable material is aluminum.

16. A device as described in claim 13, wherein the guide means cooperate with the periphery of the integrated circuit die for aligning the same.

17. A device as described in claim 13, additionally comprising guide means formed on said interconnecting die for positioning the connecting means adjacent the second set of contact means.

18. A device as described in claim 17, wherein the guide means for the connecting means are formed of anodized material.

19. A device as described in claim 17, wherein the connecting means comprise leads and the guide means cooperate with sides of the leads for guiding the leads over the second set of contact means.

20. A device as described in claim 13, wherein the contact means on said integrated circuit die comprise raised contact pads and the first set of contact means comprise depressions adapted to receive the raised contact pads on the integrated circuit die, thereby properly aligning the circuit die.

21. A device as described in claim 13, wherein the interconnecting die is formed of silicon and the first and second sets of contact means are connected by portions of a conductive layer of aluminum.

22. A device as described in claim 13, additionally comprising a glass frit for hermetically sealing said integrated circuit die and said interconnecting die together.

23. A device as described in claim 13, wherein the encapsulating means comprises epoxy.

24. A self-aligning integrated circuit package for an integrated circuit die of the type that has contact means formed thereon at predetermined locations, said package comprising:
an interconnecting die formed of a substrate of an anodizable material and having a first set of contact means formed and arranged to contact the contact means of the circuit die when placed in juxtaposition and properly aligned therewith and a second set of contact means electrically connected to the first set of contact means by conducting regions of said substrate, said conducting regions being electrically isolated by non-conducting regions of said substrate;
guide means formed of anodized material on said interconnecting die for aligning the integrated circuit die on the interconnecting die; and
connecting means connected to the second set of contact means for providing means to connect to external elements.

25. A package as described in claim 24, wherein the anodizable material is aluminum.

26. A package as described in claim 24, additionally comprising guide means formed on said interconnecting die for positioning the connecting means.

27. A package as described in claim 24, wherein the guide means are formed of an anodized material.

28. A method of making an interconnecting die for an integrated circuit package, comprising the steps of:
forming a protective dielectric layer on a surface of an anodizable substrate material;
removing the dielectric in selected regions to expose the anodizable material;
anodizing at least a portion of the anodizable material in the selected regions by submerging the anodizable material in an anodizing solution and applying an anodizing potential to the material so that the exposed material in the regions becomes an anode and forms a dielectric material; and
continuing the anodizing until the dielectric material extends above the substrate surface thereby forming raised guide portions.

29. A method as described in claim 28, additionally comprising the step of forming electrically isolated conducting paths between selected contact areas on said substrate.

30. A method as described in claim 29, wherein the substrate is formed of a semiconductive material and the isolated conducting paths are formed by depositing a conductive material over the protective dielectric layer.

31. A method as described in claim 30, additionally comprising the step of removing the dielectric material from the selected contact areas prior to anodization so that said contact areas have raised surfaces after anodization.

32. A method as described in claim 31, additionally comprising the step of removing the anodized material from certain of said selected contact areas to form depressions prior to depositing said conductive material.

33. A method as described in claim 32, additionally comprising the step of plating additional conductive material over certain of said selected contact areas.

34. A method as described in claim 28, wherein the anodizing solution contains an acid.

35. A method as described in claim 28, wherein the anodizing solution is selected from a group including sulfuric, phosphoric, boric and nitric acid solutions.

36. A method as described in claim 28, wherein the anodizing potential is increased to a point wherein an exothermic reaction results causing rapid anodization of the exposed material.

37. A method as described in claim 36, wherein the depth of anodization and the height by which the anodized material extends above the substrate surface corresponds to the width of the selected region of exposed material.

38. A method as described in claim 28, wherein a plurality of interconnecting die are formed on a single sheet and are thereafter separated by scribing and breaking.

39. A method of making an interconnecting die for an integrated circuit package, comprising the steps of:
masking selected conductive paths with a dielectric material on the surface of a substrate of a conductive and anodizable material;
anodizing the material in the unmasked areas by submerging the material in an anodizing solution and applying an anodizing potential to the material so that the exposed material becomes an anode and is anodized to form a dielectric insulating material in the unmasked areas; and
continuing said anodization until said anodized material extends above the surface of the masked conductive paths thereby forming raised guide portions.

40. A method as described in claim 39, wherein anodization is continued until all the material in the unmasked areas is anodized and the conductive paths are isolated.

41. A method as described in claim 39, additionally comprising the step of anodizing the opposite surface of the substrate to a depth sufficient to isolate the conductive paths.

42. A method as described in claim 39, additionally comprising the step of removing unanodized material from the reverse side until the conductive paths are isolated.

43. A method as described in claim 39, wherein the anodizable material is aluminum.

44. A method as described in claim 43, wherein the aluminum is anodized in a solution selected from a group including sulfuric, phosphoric, oxalic and chromic acid solutions.

45. A method as described in claim 39, additionally comprising the steps of:
removing the dielectric mask from selected contact areas of the conductive paths; and plating a metal onto the contact areas of the conductive paths.

46. A method as described in claim 39, additionally comprising the step of:

removing at least a portion of the anodized material from a central portion of the substrate to a level slightly above the masked conductive paths, said central portion having a shape corresponding to an integrated circuit die and extending over portions of the conductive paths so that the portions of the conductive paths in said central portion form contact areas and the anodized material in the central portion support and guide said circuit die for alignment on said interconnecting die.

47. A method as described in claim 39, additionally comprising the steps of:

remasking the surface of the substrate so that only a central portion is exposed, said central portion having a shape corresponding to an integrated circuit die and extending over portions of the conductive paths so that the portions of the conductive paths in the central portion form contact areas for the integrated circuit die; and etching the anodized material in a plating solution of the type that etches the anodized material and simultaneously plates a contact metal onto the exposed unanodized material.

48. A method as described in claim 47, wherein the anodizable material is aluminum and the plating solution is a hydrofluoric acid-zinc sulfate solution so that zinc is plated onto the aluminum in the contact areas.

49. A method as described in claim 48, additionally comprising the step of plating a layer of tin onto the contact areas.

50. A method as described in claim 39, wherein a plurality of interconnecting die are formed on a single sheet and are thereafter separated by scribing and breaking.

51. A method of packaging an integrated circuit die, comprising the steps of:

forming an interconnecting die of an anodizable material having conductive portions connecting circuit die contact areas with connecting means contact areas;

forming raised guide means on said interconnecting die by anodizing a portion of the anodizable material;

placing a circuit die of the type having contact pads on said interconnecting die, said circuit die being guided in place by the raised guide means so that the contact pads on the circuit die engage the circuit die contact areas of the interconnecting die;

bonding said engaged contact pads and areas; and hermetically sealing said circuit die and interconnecting die.

52. A method as described in claim 51, additionally comprising the steps of:

placing connecting means onto said interconnecting die, said means being guided in place by the raised guide means to make contact with the connecting means contact areas of the interconnecting die; and bonding said connecting means to said contact areas.

53. A method as described in claim 52, additionally comprising the step of encapsulating said integrated circuit device.

54. A method as described in claim 51, additionally comprising the steps of:

prior to hermetic sealing, placing connecting means onto said interconnecting die, said connecting means being guided in place by the raised guide means to make contact with the connecting means contact areas of the interconnecting die; and bonding said connecting means to said contact areas.

55. A method as described in claim 54, additionally comprising the step of encapsulating said integrated circuit device.

56. A method of making an interconnecting die of anodizable material for an integrated circuit package, comprising the steps of:

anodizing at least a portion of the anodizable material in selected regions of a substrate of anodizable material to form a dielectric material; and continuing the anodization until the dielectric material extends above the substrate surface thereby forming raised guide portions.

57. An interconnecting die for use in integrated circuit packaging for connecting contact means of an integrated circuit die with contact means of an integrated circuit package, said interconnecting die comprising:

a substrate; of anodizable material first contact means associated with said substrate to contact the contact means of the integrated circuit die when placed in juxtaposition and properly aligned with the integrated circuit die;

second contact means associated with said substrate to contact the contact means of the integrated circuit package when placed in juxtaposition and properly aligned therewith;

means for electrically connecting said first and second contact means; and guide means formed of anodized material on said substrate for guiding and aligning at least one of said circuit die and package contact means onto the substrate, whereby the contact means of the integrated circuit die and the contact means of the package may be aligned and connected using a single element with a minimum of bonding steps.

58. An interconnecting die as described in claim 57, wherein the substrate is formed of silicon.

59. An interconnecting die as described in claim 58, wherein the conducting regions comprise portions of a layer of conducting material formed on said substrate.

60. An interconnecting die as described in claim 57, wherein the substrate is formed of aluminum and the guide means and non-conducting regions comprise anodized aluminum which electrically isolates the conducting regions of aluminum.

61. As interconnecting die as described in claim 57, wherein the guide means is formed to cooperate with the periphery of the integrated circuit die for aligning the same.

62. An interconnecting die as described in claim 57, wherein the package contact means comprise leads and the guide means are formed to cooperate with sides of the leads for guiding the leads into regions between adjacent guide means.

63. An interconnecting die for use in integrated circuit packaging for connecting contact means of an integrated circuit die with contact means of an integrated circuit package, said interconnecting die comprising:

a substrate formed of anodizable material including conducting and non-conducting regions;

first contact means associated with said substrate to contact the contact means of the integrated circuit die when placed in juxtaposition and properly aligned with the integrated circuit die; and second contact means including anodized material formed in said substrate and covered by a layer of aluminum to contact the contact means of the integrated circuit package when placed in juxtaposition and properly aligned therewith, said conducting regions of the substrate being formed and arranged for electrically connecting said first and second contact means of the interconnecting die, whereby the contact means of the integrated circuit die and the contact means of the package may be connected using a single element with a minimum of bonding steps.

64. A method of packaging an integrated circuit die, comprising the steps of:

forming an interconnecting die of anodizable material and having conductive portions connecting circuit die contact areas with connecting means contact areas;

anodizing portions of said anodizable material to form raised guide means;

placing a circuit die of the type having contact pads on said interconnecting die, said circuit die being guided in place by the raised guide means so that the contact pads on the circuit die engage the circuit die contact areas of the interconnecting die; and bonding said engaged contact pads and areas.

65. A self-aligned integrated circuit device, comprising:

an integrated circuit die having contact means formed thereon at predetermined locations;

an interconnecting die formed of a substrate of silicon having a first set of contact means in juxtaposition with and bonded to the contact means of the integrated circuit die and a second set of contact means formed of anodized silicon covered by a layer of aluminum electrically connected to the first set of contact means by conducting regions of said substrate, said conducting regions being electrically isolated by non-conducting regions of said substrate;

connecting means connected to the second set of contact means; and encapsulating means surrounding and sealing said integrated circuit die and interconnecting die, said connecting means being exposed for connection to external elements.

66. A self-aligned integrated circuit device, comprising:

an integrated circuit die having contact means formed thereon at predetermined locations;

an interconnecting die formed of a substrate of anodized aluminum having a first set of contact means in juxtaposition with and bonded to the contact means of the integrated circuit die and a second set of contact means electrically connected to the first set of contact means by conducting regions of non-anodized aluminum, said conducting regions being electrically isolated by the anodized regions of the substrate;

connecting means connected to the second set of contact means; and encapsulating means surrounding and sealing said integrated circuit die and interconnecting die, said connecting means being exposed for connection to external elements.

67. A device as described in claim 66, wherein the contact means on said integrated circuit die comprise raised contact pads and the interconnecting die is formed of anodized and unanodized aluminum regions, each of the first set of contact means comprising an unanodized region separated by upwardly extending regions of anodized aluminum for isolating adjacent contact means and for guiding and receiving said raised contact pads on said integrated circuit die.

68. A device as described in claim 67, additionally comprising a layer of plated metal over the unanodized regions of the first set of contact means.

69. An integrated circuit package for an integrated circuit die of the type that has contact means formed thereon at predetermined locations, said package comprising:

a substrate of anodizable electrically conductive material including unanodized conducting regions and anodized non-conducting regions;

first contact means associated with said substrate to contact the contact means of the integrated circuit die when placed in juxtaposition and properly aligned with the integrated circuit die;

second contact means associated with said substrate and electrically connected to the first set of contact means by the unanodized conducting regions of the substrate, said conducting regions being electrically isolated by the non-conducting anodized regions of the substrate; and connecting means connected to the second set of contact means for providing means to connect to external elements.

* * * * *